(12) United States Patent
Cheng et al.

(10) Patent No.: US 8,241,372 B2
(45) Date of Patent: Aug. 14, 2012

(54) ELECTROCHEMICAL DEVICE AND METHOD OF FABRICATING THE SAME

(75) Inventors: Hai-Peng Cheng, Taipei County (TW); Shien-Ping Feng, Hsinchu County (TW); Jo-Lin Lan, Kaohsiung (TW); Chao Peng, Taipei County (TW); Tzu-Chien Wei, Hsinchu (TW); Wen-Chi Hsu, Tainan County (TW); Ya-Huei Chang, Taoyuan County (TW); Wen-Hsiang Chen, Hsinchu (TW)

(73) Assignee: Tripod Technology Corporation, TaoYuan County (TW)

( * ) Notice: Subject to any disclaimer, the term of this patent is extended or adjusted under 35 U.S.C. 154(b) by 744 days.

(21) Appl. No.: 12/366,659

(22) Filed: Feb. 6, 2009

(65) Prior Publication Data
US 2010/0071839 A1 Mar. 25, 2010

(30) Foreign Application Priority Data

Sep. 23, 2008 (TW) ................. 97136501 A

(51) Int. Cl.
*H01M 4/04* (2006.01)
*H01M 4/02* (2006.01)
*H01L 31/0224* (2006.01)
*B29C 65/00* (2006.01)

(52) U.S. Cl. ....... 29/623.1; 429/208; 429/209; 136/252; 156/145; 502/101

(58) Field of Classification Search ............... 429/405, 429/417, 218.1, 50, 209, 208; 156/145; 423/447.4; 252/500; 428/508; 29/623.1; 136/252
See application file for complete search history.

(56) References Cited

U.S. PATENT DOCUMENTS

| 4,115,528 | A | * | 9/1978 | Christner et al. | .......... 423/447.4 |
| 2001/0052591 | A1 | * | 12/2001 | Kovalev et al. | ............... 252/500 |
| 2004/0166392 | A1 | * | 8/2004 | Shah et al. | ...................... 429/36 |
| 2005/0098437 | A1 | * | 5/2005 | Shiepe | .......................... 205/109 |

FOREIGN PATENT DOCUMENTS
CN 1421053 A 5/2003

OTHER PUBLICATIONS
Kawasaki et al., "Single-Crystalline Platinum Nanosheets from Nonionic Surfactant 2-D Self-Assemblies at Solid/Aqueous Solution Interfaces", Langmuir, 2005, 21 (24), pp. 11468-11473. Oct. 8, 2005.*

* cited by examiner

*Primary Examiner* — Jonathan Crepeau
*Assistant Examiner* — Kenneth Douyette
(74) *Attorney, Agent, or Firm* — CKC & Partners Co., Ltd.

(57) ABSTRACT

A method of forming an electrode including an electrochemical catalyst layer is disclosed, which comprises forming a graphitized porous conductive fabric layer, optionally conditioning the graphitized porous conductive fabric layer, and dipping the graphitized porous conductive fabric layer into a solution containing a plurality of polymer-capped noble metal nanoclusters dispersed therein. The polymer-capped noble metal nanoclusters as an electrochemical catalyst layer are adsorbed onto the graphitized porous conductive fabric layer. An electrochemical device with the electrode made thereby is also contemplated.

8 Claims, 4 Drawing Sheets

ELECTROCHEMICAL DEVICE AND METHOD OF FABRICATING THE SAME

RELATED APPLICATIONS

This application claims priority to Taiwan Application Serial Number 97136501, filed Sep. 23, 2008, which is herein incorporated by reference.

BACKGROUND

1. Field of Invention

The present invention generally relates to an electrochemical device and its fabricating method. More particularly, the present invention relates to a method of forming an electrode including a porous conductive fabric layer and an electrochemical catalyst layer comprised of polymer-capped nanoclusters, and to an electrochemical device including the electrode made thereby.

2. Description of Related Art

Recently, dye-sensitized solar cells (DSSC) have attracted attention as a potentially low-cost energy device. Typically, a DSSC consists of a dye-sensitized nanocrystalline semiconductor film on an Indium-tin oxide (ITO) or fluorine-doped tin oxide (FTO) glass as the photo-anode, a platinized counter electrode acting as the cathode, and iodide/tri-iodide redox couples in a proper mediator as the electrolyte. The working principle of a DSSC is summarized in the five steps below, as shown in FIG. 1. (1) Photo-excitation on dye molecules induces charge separation (see arrow 1). (2) Charge (electron) is injected into the conduction band of mesoporous titanium dioxide ($TiO_2$). (3) Charge passes through the outer circuit via the electronic load (see arrow 2). (4) Dye reduces to ground state by redox couples in the electrolyte (see arrow 3). (5) Redox couples reduce on counter electrode by the charge coming from the outer circuit (see arrow 4).

In a DSSC, the counter electrode functions as a reduction reaction site expressed as following:

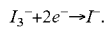

$$I_3^- + 2e^- \rightarrow I^-.$$

This reduction reaction is vital since iodide ions are responsible for the regeneration rate of oxidized dye molecules. Once the dye regeneration rate cannot catch up with the dye oxidation rate (i.e. electron injection from dye molecules to the conduction band of $TiO_2$), the conversion efficiency is reduced and the DSSC deteriorates because iodine crystals may be deposited on the surface of the counter electrode.

In the prior arts, the naked ITO or FTO glass shows extremely slow kinetics of tri-iodide reduction in organic solvents. In order to minimize the over-potential, catalyst material is applied to the ITO or FTO glass to speed up the reaction.

So far, platinum (Pt) has been used almost exclusively as the catalyst material. Depending on the cost and efficiency, there are many methods to form a thin layer of Pt. Sputtering is a common method. This platinized electrode exhibits fair performance. However, sputtering requires an ultra-high vacuum environment so that the cost of ownership remains high.

Papageorgiou et al. have developed a method called "thermal cluster platinum catalyst" (*Coord. Chem. Rev.*, 2004, 248, pp 1421). This method provides low Pt loading (about 2~10 μg/cm$^2$), superior kinetic performance (charge-transfer resistance, $R_{CT}$<0.1 Ωcm$^2$) and mechanical stability with respect to conventional platinum deposition methods like sputtering or electrochemical deposition. Wang et al. (*Surf. Interface Anal.*, 2004, 36, pp 1437) have studied the stability of thermal cluster Pt (TCP) electrode with X-ray photoelectron spectroscopy and found that the electrochemical catalytic performance of TCP may be reduced slightly due to adsorbed iodide on TCP's surface. The electrochemical catalytic performance can be regenerated with re-heating treatment, but this method requires heating of up to 380° C. It consumes power, and is not suitable for mass production.

Other materials such as carbon and conducting polymers are also proposed to be the catalyst for tri-iodide reaction in DSSC. These new materials usually need to be deposited as thicker films on the substrate to obtain acceptable catalytic effect, and are still being developed.

Hence, lots of research on DSSC and technologies relative to DSSC address lower costs of materials and higher performance of cells.

SUMMARY

It is therefore an objective of the invention to provide a method of forming an electrode with a porous conductive fabric layer and an electrochemical catalyst layer comprised of polymer-capped nanoclusters. Using this method, the adhesion between the electrochemical catalyst layer and an underlying layer is improved.

It is another objective of the invention to provide a method of manufacturing an electrochemical device including an electrode made by the aforementioned method. The performance of the electrochemical device is better because the electrode thereof has greater catalytic effect.

In accordance with one aspect of the invention, a method of forming an electrode with an electrochemical catalyst layer is provided. The method includes the steps of graphitizing a porous conductive fabric layer, optionally conditioning the graphitized porous conductive fabric layer, and immersing the graphitized porous conductive fabric layer in a solution containing a plurality of polymer-capped noble metal nanoclusters, and thereby the polymer-capped noble metal nanoclusters are adsorbed onto the graphitized porous conductive fabric layer to form a polymer-protected electrochemical catalyst layer.

In accordance with another aspect of the invention, an electrochemical device is provided, which includes two electrodes and a separating membrane disposed between the electrodes. Either one or both of the electrodes include a substrate, a porous conductive fabric layer formed on the substrate, and an electrochemical catalyst layer comprised of polymer-capped noble metal nanoclusters. The polymer-capped noble metal nanoclusters are adsorbed on the top surface and/or within the pores of the porous conductive fabric layer.

In accordance with still another aspect of the invention, a method of forming an electrode with an electrochemical catalyst layer is provided. The method includes the steps of providing a conductive fabric layer having a support portion and a porous portion, modifying the porous portion of the conductive fabric layer, and immersing the conductive fabric layer in a solution containing a plurality of polymer-capped noble metal nanoclusters to form a polymer-protected electrochemical catalyst layer over the porous portion of the conductive fabric layer.

In accordance with still another aspect of the invention, an electrochemical device is provided, which includes two electrodes and a separating membrane disposed between the electrodes. Either one or both of the electrodes include a conductive fabric layer having a support portion and a porous portion, and include an electrochemical catalyst layer comprised of polymer-capped noble metal nanoclusters. The polymer-capped noble metal nanoclusters are adsorbed on the upper surface and/or inside the pores of the porous portion of the conductive fabric layer.

As embodied and broadly described herein, the porous conductive fabric layer provides a large surface area for noble metal nanoclusters being adsorbed thereto such that the amount of catalysts is increased. Because the polymer-protected electrochemical catalyst layer effectively adheres to the porous portion of a conductive fabric layer, the resultant electrochemical device has improved performance and stability.

It is to be understood that both the foregoing general description and the following detailed description are by examples, and are intended to provide further explanation of the invention as claimed.

BRIEF DESCRIPTION OF THE DRAWINGS

The foregoing and other objects, features and advantages of the present invention will become more apparent from the following detailed description when taken in conjunction with the accompanying drawings, in which.

DESCRIPTION OF THE PREFERRED EMBODIMENTS

Figure 1:
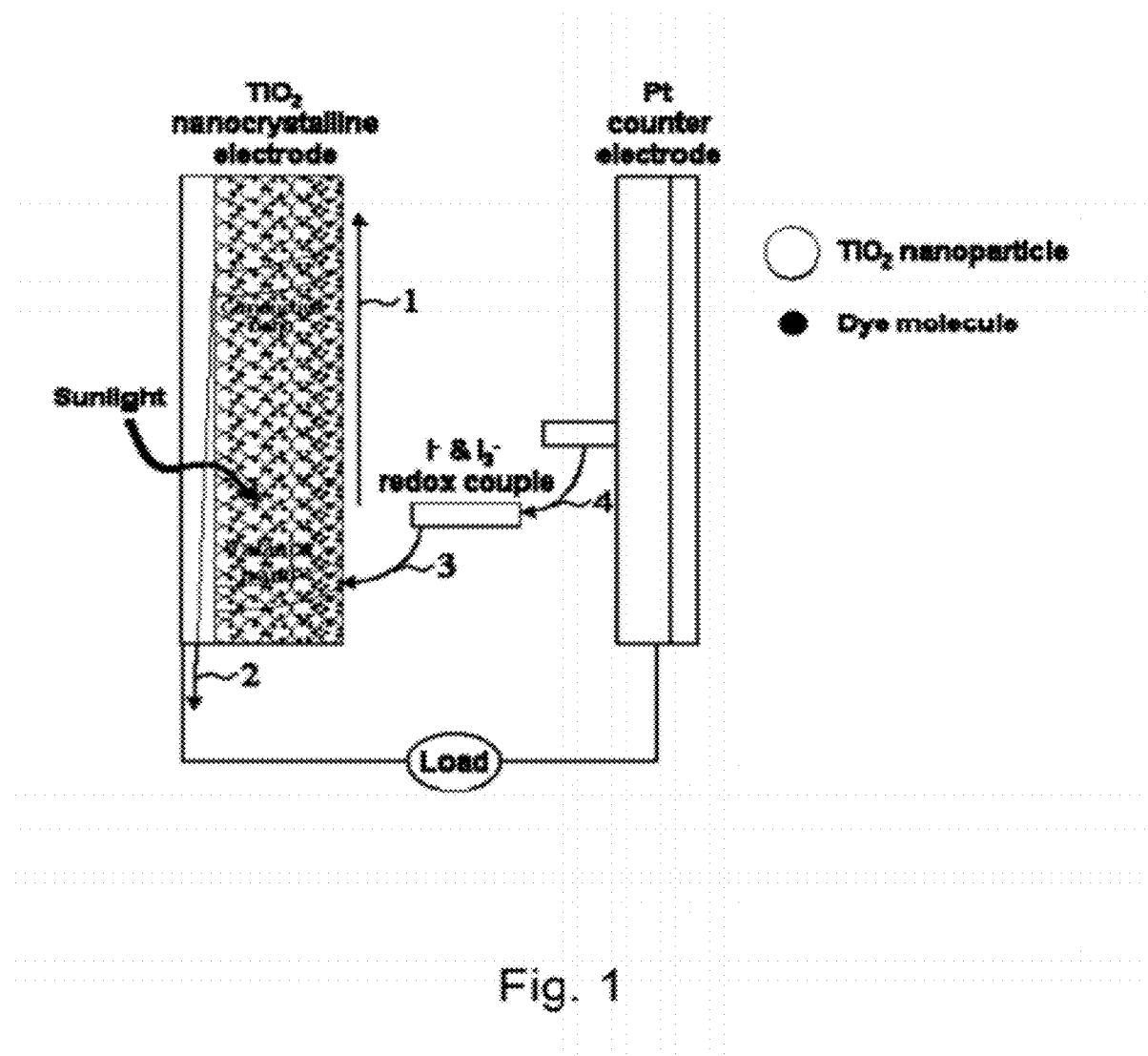
FIG. 1 is a schematic view showing the working principle of a conventional DSSC.

Reference will now be made in detail to the preferred embodiments of the invention, examples of which are illustrated in the accompanying drawings. Wherever possible, the same reference numbers are used in the drawings and the description to refer to the same or like parts. It is to be noted that the description provided herein is intended to be illustrative, and not restrictive, for the invention may admit to other equally effective embodiments.

Figure 2A:
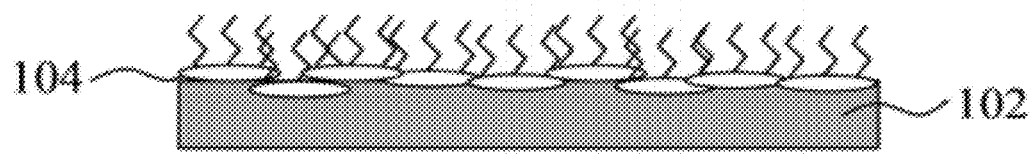
FIG. 2A through FIG. 2C are cross-sectional views illustrating a method of forming an electrode having a porous conductive fabric layer and an electrochemical catalyst layer according to one embodiment of the invention.
Figure 2B:
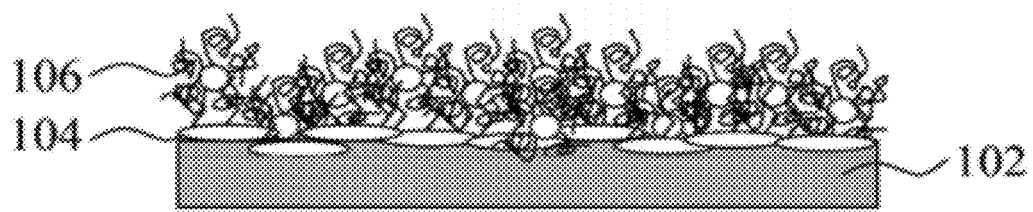
Figure 2C:
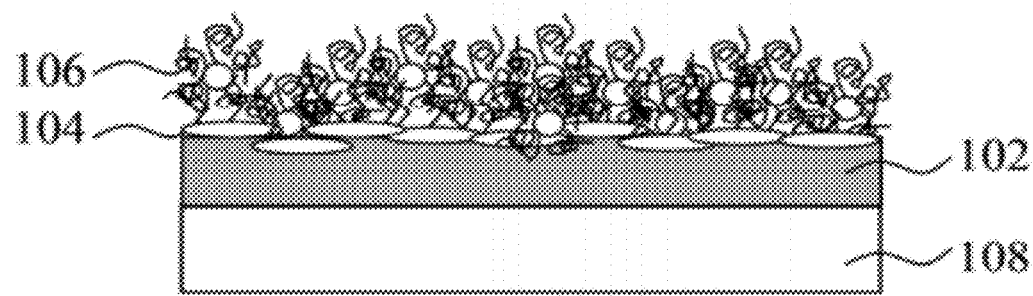

FIG. 2A through FIG. 2C are cross-sectional views illustrating a method of forming an electrode having a porous conductive fabric layer and an electrochemical catalyst layer according to one embodiment of the invention. Referring to FIG. 2A, a porous conductive fabric layer 102 adapted to transfer charges is provided. Preferably, the porous conductive fabric layer 102 is composed of carbon or graphite, for being subsequently subjected to high temperature processing and improving the conductivity. More preferably, the porous conductive layer 102 is carbonized at high temperature (e.g. graphitized) to reinforce its porous structure, for example, by thermally treating at 3000° C. or above in an anaerobic environment. The porous conductive fabric layer 102 may be a graphitized film in the form of nets, grids or stripes. Alternatively, the porous conductive fabric layer 102 may be a cloth made from carbon fibers, which is available from KUREHA co., Japan, or other products known to those skilled in the art. The porous conductive fabric layer 102 may be manufactured by conventional methods with no particular limitation.

Optionally, the porous conductive fabric layer 102 is conditioned or modified by, for example, immersing or dipping the porous conductive layer 102 in a solution containing surfactants to form a conditioner layer 104 on the surface and/or inside the pores of the conductive fabric layer 102. Preferably, a cationic surfactant is utilized, and quaternary ammonium salt is the common one. The conditioner layer is adapted to change the surface charge state, so as to improve the adhesion between the conductive fabric layer 102 and a succeeding film.

Referring to FIG. 2B, the porous conductive fabric layer 102 is then immersed in a second solution. Such kinds of solutions contain polymer-capped noble metal nanoclusters dispersed therein. These polymer-capped noble metal nanoclusters are attached to the conditioner layer 104 on the upper surface or within the pores of the porous conductive fabric layer 102; or, the polymer-capped noble metal nanoclusters are trapped in the pores. Thus, a noble metal catalyst layer 106 is formed over the conditioner layer 104. In one embodiment, a cationic surfactant is used to condition the conductive layer, resulting in the polymer-capped noble metal with negative charges being adsorbed thereto. The conductive fabric layer 102 has a large surface area due to its high porosity. The noble metal nanoclusters may also be attached to or adsorbed on the inner surface of pores, and hence the amount of noble metals as catalysts is increased.

The second solution may be initially prepared by providing a polymer solution capable of capping a noble metal, followed by adding the precursor of noble metal salt into the polymer solution. Preferably, the polymer solution is composed of poly(N-vinyl-2-pyrrolidone) (PVP), poly(acrylamide) (PAM), poly(vinyl alcohol) (PVAL), poly(acrylic acid) (PAA), poly(ethyleneimine) (PEI) or the like. Preferably, the noble metal from precursors is palladium (Pd), platinum (Pt), ruthenium (Ru), silver (Ag), gold (Au), or any other noble metal which can serve as a catalyst in a reduction reaction. Finally, the reductant for precursors is introduced into the polymer solution containing noble metal salt, and thus the noble metal salt is reduced to noble metal nanoclusters dispersed uniformly in the solution since the polymers cap the noble metal. As such, when the porous conductive fabric layer 102 is dipped into the second solution, an electrochemical catalyst layer formed from polymer-capped nanoclusters of the noble metal is uniformly distributed thereon. The method of preparing a solution comprising polymer-capped metals is described in detail by Hidefumi Hirai et al. in *Polymers for Advanced Technologies* (12, pp 724-733), published in 2001, entitled "Protecting polymers in suspension of metal nanoparticles", which is hereby incorporated by reference in its entirety.

The formation and operation of the noble metal catalyst layer, the ratio of polymers to noble metals, and/or the succeeding processes are further described in U.S. patent application Ser. No. 11/715,426, filed on Mar. 8, 2007, entitled "Method for preparing an electrode comprising an electrochemical catalyst layer thereon", and U.S. patent application Ser. No. 12/213,307, filed on Jun. 18, 2008, entitled "Method of forming an electrode including an electrochemical catalyst layer", both of which are hereby incorporated by reference in their entirety to the extent not inconsistent with the claimed invention.

Now referring to FIG. 2C, the porous conductive fabric layer 102 along with the noble metal catalyst layer 106 in FIG. 2B is attached to a substrate 108. The substrate 108 may be a conductive substrate, such as a sheet of ITO or conductive plastic. Alternatively, the substrate 108 may be non-conductive like common glass or plastic. In one embodiment, a non-conductive substrate is combined with the porous conductive fabric layer 102 to substitute a conventional conductive substrate. In another embodiment, a flexile substrate is used with a cloth-type conductive layer. The material of the substrate 108 is not limited, but is preferably glass or plastic as applied to the electrode of a solar cell.

It should be understood that the method described above may proceed in a different order. For example, the porous conductive fabric layer 102 is formed on the substrate 108 before conditioning or forming the noble metal catalyst layer 106. In case the substrate is not durable for high temperature operations, the noble metal catalyst layer 106 is formed on the porous conductive fabric layer 102 and thermally treated first, and the combined layers are then attached to the substrate 108. The sequence of processes depends on the types of substrates, the temperature of processing, the configuration of electrodes, and so forth.

Figure 3A:
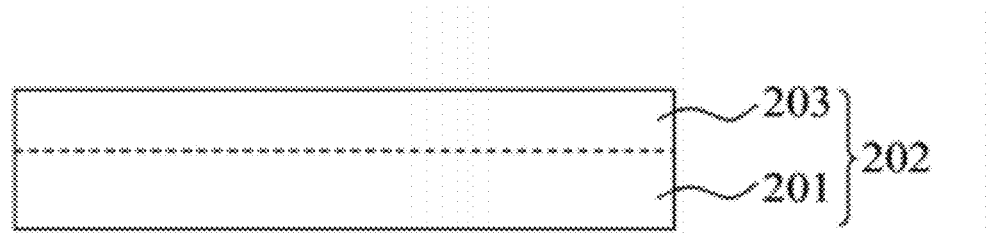
FIG. 3A through FIG. 3C are cross-sectional views illustrating a method of forming an electrode having a porous conductive fabric layer and an electrochemical catalyst layer according to another embodiment of the invention.
Figure 3B:
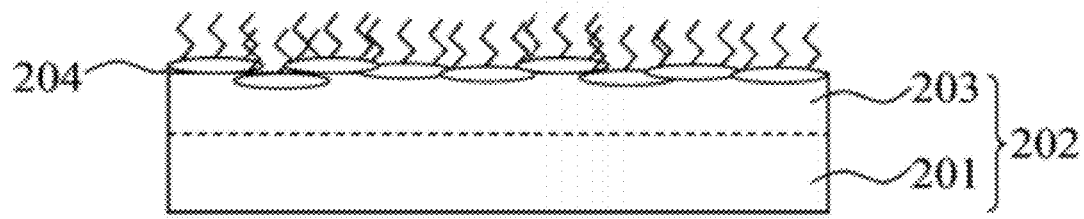
Figure 3C:
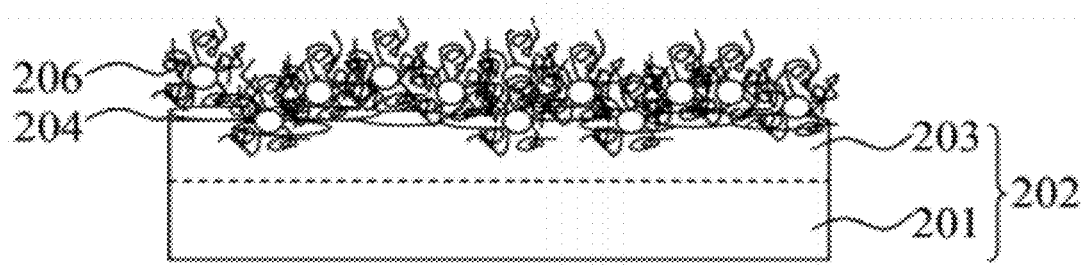

FIG. 3A through FIG. 3C are cross-sectional views illustrating a method of forming an electrode having a porous conductive fabric layer and an electrochemical catalyst layer according to another embodiment of the invention. Referring to FIG. 3A, a porous conductive fabric layer 202 having a support portion 201 and a porous portion 203 is provided. The support portion 201 is the main support of the configuration. The porous portion 203 is adapted to transfer charges. Preferably, the porous conductive fabric layer 202 is composed of carbon or graphite, for being subsequently subjected to high temperature processing and improving the conductivity. More preferably, the porous conductive fabric layer 202 is carbonized at high temperature or graphitized to reinforce its porous structure. The porous conductive fabric layer 202 may be a graphitized film in the form of nets, grids or stripes. Alternatively, the porous conductive fabric layer 202 may be a cloth made from carbon fibers, which is available from KUREHA co., Japan, or other products known to those skilled in the art. In one embodiment, a thermal curing or ultraviolet (UV) curing step is performed to make carbon fibers or graphite contained in the porous conductive layer crosslink with a polymer to become the bottom support (i.e. support portion 201).

As shown in FIG. 3B, the porous conductive fabric layer 202 is optionally conditioned or modified by, for example, immersing or dipping the porous conductive fabric layer 202 in a solution containing surfactants to form a conditioner layer 204 on the surface of the porous portion 203 and/or inside its pores. Preferably, a cationic surfactant is utilized, and quaternary ammonium salt is the common one. The conditioner layer is adapted to change the surface charge state, so as to improve the adhesion between the conductive layer 202 and a succeeding film.

Referring to FIG. 3C, the porous conductive fabric layer 202 is immersed in a second solution. Such kinds of solutions contain polymer-capped noble metal nanoclusters dispersed therein. These polymer-capped noble metal nanoclusters in the second solution are adsorbed onto the conditioner layer 204 over the top surface or within the pores of the porous portion 203; or, the polymer-capped noble metal nanoclusters are trapped in the pores. Thus, a noble metal catalyst layer 206 is formed on the conditioner layer 204. In one embodiment, a cationic surfactant is used to condition the conductive layer, resulting in the polymer-capped noble metal with negative charges being adsorbed thereto. The conductive fabric layer 202 has a porous portion 203 with a large surface area for the noble metal nanoclusters being attached or adsorbed, and hence the amount of noble metals as catalysts is increased. Furthermore, the support portion 201 of the conductive fabric layer 202 may sustain the structure of an electrode as a substrate, so there is no concern about the adhesion between the conductive layer and a conventional substrate.

Figure 4:
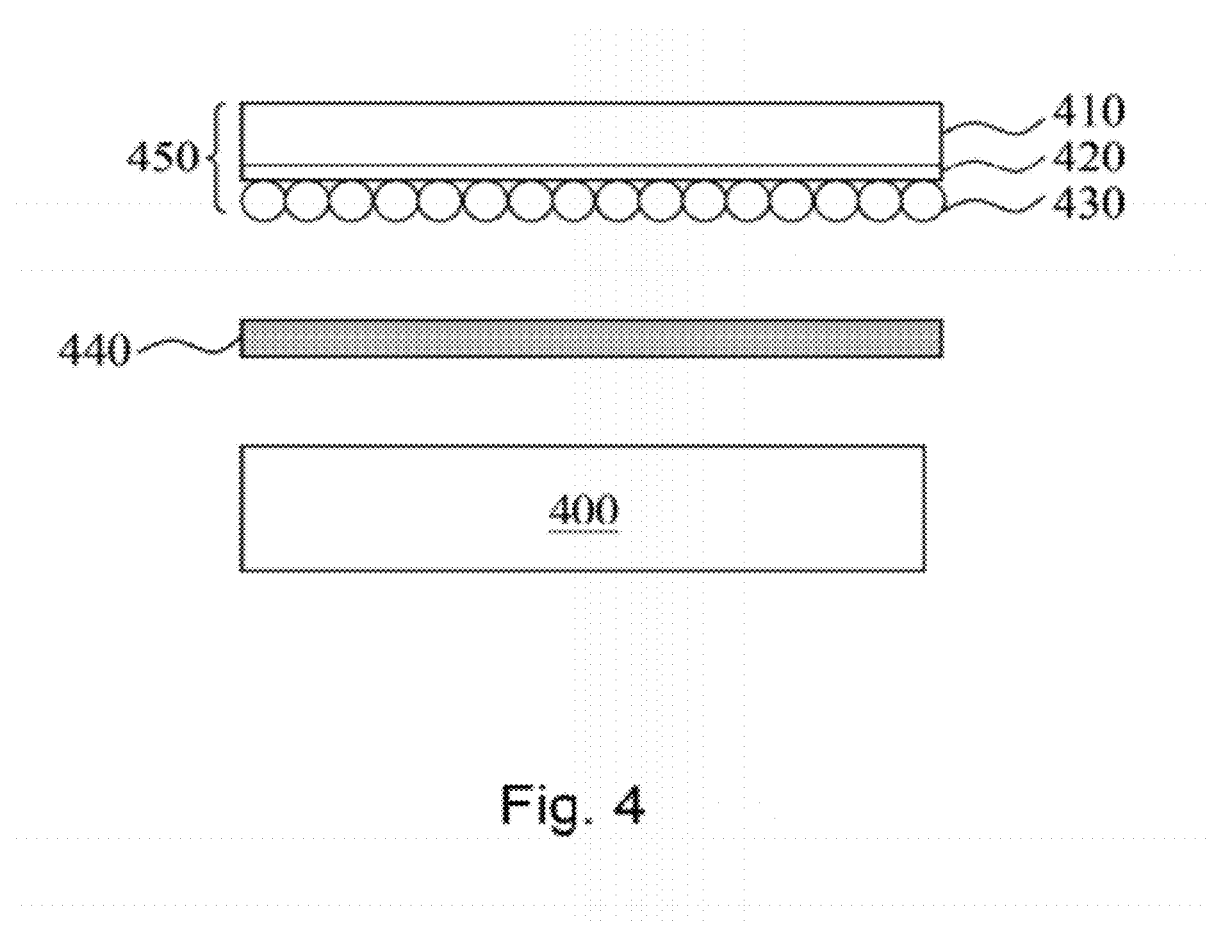
FIG. 4 shows the exploded view of an electrochemical device according to one embodiment of the invention.

FIG. 4 is the exploded view of an electrochemical device with an electrode made in accordance with one embodiment of the invention. The electrochemical device encompasses all types of devices to perform electrochemical reactions. Particular examples of the electrochemical device are fuel cells or solar cells. A dye-sensitized solar cell (DSSC) is illustrated hereinafter and taken as an exemplar only. As shown in FIG. 4, the electrochemical device includes a cathode 400, an anode 450, and a separating membrane 440 disposed between the cathode 400 and the anode 450.

The cathode 400 is formed by the methods described in FIGS. 2A-2C or in FIGS. 3A-3C. In one embodiment, the cathode includes a substrate with a porous conductive fabric layer thereon, a conditioner layer formed on the porous conductive fabric layer, and a plurality of polymer-capped noble metal nanoclusters grabbed by the conditioner layer as an electrochemical catalyst layer of the electrode. In another embodiment, the cathode includes a porous conductive fabric layer consisting of a support portion and a porous portion, a conditioner layer formed over the upper surface or within the pores of the porous portion, and a plurality of polymer-capped noble metal nanoclusters grabbed by the conditioner layer as an electrochemical catalyst layer of the electrode.

Preferably, the porous conductive fabric layer is composed of graphite. More preferably, the porous conductive fabric layer is carbonized at high temperature or graphitized. In one example, the porous conductive fabric layer is a graphitized film in the form of nets, grids or stripes. In another example, the porous conductive layer is a fabric made from carbon fibers. Preferably, the polymer contained in the electrochemical catalyst layer of the electrode is poly(N-vinyl-2-pyrrolidone (PVP), poly(acrylamide) (PAM), poly(vinyl alcohol) (PVAL), poly(acrylic acid) (PAA), poly(ethyleneimine) (PEI) or the like, and the noble metal capped by polymers is selected from the group consisting of palladium, platinum, ruthenium, silver, and gold.

The anode 450 preferably includes a transparent conductive glass 410 on a substrate. Non-limiting examples of the transparent conductive glass 410 include indium tin oxide (ITO), fluorine-doped tin oxide (FTO), antimony-doped tin oxide (ATO), aluminum-doped zinc oxide (AZO), gallium-doped zinc oxide (GZO), or indium zinc oxide (IZO). Generally, the anode 450 also includes a dye-impregnated oxide layer 430 (e.g. a $TiO_2$ layer) formed on the surface of the transparent conductive glass 410. In one embodiment, the dye-impregnated oxide layer 430 is formed on a porous conductive layer 420. The porosity of the conductive layer 420 results in an increasing loading of the oxide layer 430. The features and characteristics of the porous conductive layer 420 are similar to those of the aforementioned porous conductive fabric layers. The anode of a DSSC may be manufactured by a conventional method known to those skilled in the art.

In a further embodiment of the electrochemical device, an electrode formed by the methods described in FIGS. 2A~2C or in FIGS. 3A~3C is used as the anode 450.

After forming the cathode 400 and the anode 450, the electrodes are assembled by, for example, a conventional method known to those skilled in the art to construct an electrochemical device. In one embodiment, a separating membrane 440 is disposed between the cathode 400 and the anode 450, and an electrolyte (not shown) is injected into the space between the electrodes through an inlet. The separating membrane 440 is preferably a porous insulator made of organic, inorganic or biopolymers, for example. The separating membrane usually has high wettability, so the electrolyte can readily diffuse between the cathode 400 and the anode 450. Particularly, the timing for injecting the electrolyte into the electrochemical device depends on the desired quality of the electrochemical device and the manufacturing process for the final product. Hence, the electrolyte may be injected into the electrochemical device during the assembly of the electrochemical device or at the final step of the assembly.

As can be seen from the foregoing, the porous conductive fabric layer provides a large surface area for the adsorption of noble metal nanoclusters, and thus the amount of catalyst is increased. On the other hand, a non-conductive substrate combined with the porous conductive fabric layer can replace an expansive conductive substrate. Additionally, a conductive layer can be processed to form a support portion and a porous portion. Since these two portions are integral, the adhesion between them is superior to a conventional substrate with a conductive layer formed thereon.

It will be apparent to those skilled in the art that various modifications and variations can be made to the concept of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an electrochemical device, the method comprising:
   forming a first electrode, comprising:
      providing a graphitized porous conductive fabric layer;
      conditioning the graphitized porous conductive fabric layer with a first solution containing a cationic surfactant to form a conditioner layer on the graphitized porous conductive fabric layer;
      taking out the graphitized porous conductive fabric layer with the conditioner layer from the first solution; and
      immersing the graphitized porous conductive fabric layer with the conditioner layer in a second solution, containing a plurality of negatively-charged polymer-capped noble metal nanoclusters dispersed in the second solution, to form a polymer-protected electrochemical catalyst layer on the graphitized porous conductive fabric layer by adsorbing the polymer-capped noble metal nanoclusters on the conditioner layer;
   forming a second electrode;
   placing a separating membrane between the first electrode and the second electrode; and
   injecting an electrolyte into a space between the first electrode and the second electrode.

2. The method of claim 1, wherein for forming the first electrode, the graphitized porous conductive fabric layer comprises a fabric made from carbon fibers or a carbon-containing layer graphitized at a high temperature.

3. The method of claim 1, wherein for forming the first electrode, the graphitized porous conductive fabric layer further comprises a portion of the graphitized porous conductive fabric layer polymerized by polymer.

4. The method of claim 3, wherein for forming the first electrode, the polymerized graphitized porous conductive fabric layer is cured to form a support portion.

5. The method of claim 1, wherein forming the first electrode further comprises attaching the graphitized porous conductive fabric layer with the polymer-protected electrochemical catalyst layer to a substrate.

6. The method of claim 1, wherein forming the first electrode further comprises:
   providing a substrate; and
   forming the graphitized porous conductive fabric layer on the substrate.

7. The method of claim 1, wherein forming the second electrode comprises:
   providing a second substrate; and
   forming a dye-impregnated oxide layer on the second substrate.

8. The method of claim 7, wherein forming the second electrode further comprises forming a porous conductive layer between the second substrate and the dye-impregnated oxide layer.

* * * * *